(12) United States Patent
Shiina

(10) Patent No.: US 8,562,800 B2
(45) Date of Patent: *Oct. 22, 2013

(54) PLASMA GENERATING APPARATUS AND PLASMA PROCESSING APPARATUS

(75) Inventor: Yuichi Shiina, Chuo-ku (JP)

(73) Assignee: Ferrotec Corporation, Tokyo (JP)

( * ) Notice: Subject to any disclaimer, the term of this patent is extended or adjusted under 35 U.S.C. 154(b) by 309 days.

This patent is subject to a terminal disclaimer.

(21) Appl. No.: 12/736,234

(22) PCT Filed: Mar. 25, 2009

(86) PCT No.: PCT/JP2009/055935

§ 371 (c)(1),
(2), (4) Date: Dec. 3, 2010

(87) PCT Pub. No.: WO2009/119655

PCT Pub. Date: Oct. 1, 2009

(65) Prior Publication Data

US 2011/0068004 A1    Mar. 24, 2011

(30) Foreign Application Priority Data

Mar. 27, 2008 (JP) .................. 2008-083750

(51) Int. Cl.
*C23C 14/00* (2006.01)
*H01J 27/14* (2006.01)

(52) U.S. Cl.
USPC ............................ 204/298.41; 204/192.38

(58) Field of Classification Search
USPC ........................ 204/298.41, 192.38
See application file for complete search history.

(56) References Cited

U.S. PATENT DOCUMENTS

| 5,476,691 | A | * | 12/1995 | Komvopoulos et al. | ...... 427/527 |
| 6,663,755 | B2 | * | 12/2003 | Gorokhovsky | .......... 204/298.41 |
| 7,033,462 | B2 | * | 4/2006 | Murakami et al. | ....... 204/192.38 |
| 2007/0187229 | A1 | * | 8/2007 | Aksenov et al. | ......... 204/192.38 |

FOREIGN PATENT DOCUMENTS

| JP | H05-130036 | 1/1993 |
| JP | 2002-8893 | 1/2002 |
| JP | 2002-69621 | 3/2002 |
| JP | 2002-105628 | 4/2002 |

(Continued)

OTHER PUBLICATIONS

P.J. Martin et al., "Ion-Beam Deposited Films Produced by Filtered Arc Evaporation", Thin Solid Films, 1990, pp. 77-83, 193/194, Elsevier Sequoia, Netherlands.

*Primary Examiner* — Rodney McDonald
(74) *Attorney, Agent, or Firm* — DLA Piper LLP (US)

(57) ABSTRACT

A plasma processing apparatus using a plasma generating apparatus by which droplets mixed in plasma can be efficiently removed and surface processing precision can be improved in film formation wherein high purity plasma is used. A droplet removing portion arranged in a plasma advancing path is composed of a straight plasma advancing tube (P0) connected to a plasma generating portion (A); a first plasma advancing tube (P1) connected to the straight plasma advancing tube (P0) in a bent manner; a second plasma advancing tube (P2) connected to a finishing end of the first plasma advancing tube (P1) by being inclinedly arranged at a predetermined inclination angle with respect to the tube axis of the first plasma advancing tube; and a third plasma advancing tube (P3), which is connected to the finishing end of the second plasma advancing tube (P2) in a bent manner and discharges plasma from a plasma outlet.

13 Claims, 12 Drawing Sheets

(56) References Cited

FOREIGN PATENT DOCUMENTS

| JP | 2003-178708 | 6/2003 |
| JP | 2005-216575 | 8/2005 |
| JP | 2005-264255 | 9/2005 |
| JP | 2006-274294 | 10/2006 |

* cited by examiner (6A)

(6B)

(8 A)

(8 B)

PLASMA GENERATING APPARATUS AND PLASMA PROCESSING APPARATUS

FIELD OF THE INVENTION

The present invention concerns with a plasma generating apparatus comprising a droplet removing section that removes cathode material particles that are produced from a cathode as a byproduct at the time of generation of plasma (henceforth referred to as "droplets") as the plasma is generated from the target surface by a vacuum arc discharge at an arc discharge portion set under a vacuum environment, and a plasma processing apparatus for doing plasma treatment using the plasma generated by said plasma generating apparatus.

BACKGROUND ART

Commonly, it is known that by forming a film on the surface of a solid material in plasma or by injecting ions, the solid surface characteristics can be improved. A film formed using plasma that includes metal or nonmetal ions strengthens the abrasion/corrosion resistance of the solid surface, and it is useful as a protective film, an optical thin film, a transparent electroconductive film, or such. In particular, a carbon film using carbon plasma comprises an amorphous conglomerate of the diamond and the graphite structures, and its utility value is high as a diamond like carbon film (referred to as a "DLC film").

As a method for generating plasma including metal or nonmetal ions, there is a vacuum arc plasma technique. Vacuum arc plasma is plasma formed by an electric arc discharge generated between the cathode and the anode, wherein the cathode material evaporates from a cathode spot existing on the cathode surface, and said plasma is formed from this cathode-vaporized material. In addition, when a reactive gas is introduced as the atmosphere gas, the reactive gas is ionized simultaneously. An inert gas (referred to as a "noble gas") may be introduced along with said reactive gas, and also, said inert gas can be introduced instead of said reactive gas. A surface treatment can be done by using such plasma for a thin film formation on a solid surface or an injection of ion.

Normally, in a vacuum arc discharge, vacuum arc plasma constituent particles such as cathode material ions, electrons, and cathode material neutral particles (atoms and molecules) are ejected from the cathode spot, and at the same time, cathode material particles called droplets with size from less than submicron to several hundred microns (0.01-1000 μm) are also ejected. However, what becomes a problem in a surface treatment such as film formation is generation of the droplets. When these droplets adhere to the surface of the object to be treated, the uniformity of the film formed on the surface of the object to be treated is lost, and the film becomes a defective product.

As a method to solve the problem of droplets, there is a magnetic filter method (P. J. Martin, R. P. Netterfield and T. J. Kinder, Thin Solid Films 193/194 (1990)77) (Non-Patent Document 1). In this magnetic filter method, vacuum arc plasma is transported to a processing portion through a curved droplet collecting duct. According to this method, the droplets which were generated are adhered and captured (collected) on the duct inner circumferential wall, and a plasma stream that nearly does not contain droplets is obtained at the duct outlet. Also, a curved magnetic field is formed by magnets arranged along the duct. The plasma stream is bent by this curve magnetic field, and it is configured so that the plasma is guided efficiently to the plasma processing portion.

A plasma arc processing apparatus having a droplet collecting portion is disclosed in the Japanese Patent Laid-Open No. 2002-8893 bulletin (Patent Document 1). FIG. 12 is a schematic configuration diagram of a conventional plasma arc processing apparatus. At plasma generating portion 102, an electric spark is generated between cathode 104 and trigger electrode 106, a vacuum arc is generated between cathode 104 and anode 108, and plasma 109 is generated. To plasma generating portion 102, power supply 110 for generating electric spark and vacuum arc discharge is connected, and plasma stabilizing magnetic field generators 116a, 116b for stabilizing plasma 109 are arranged. Plasma 109 is guided from plasma generating portion 102 to plasma processing portion 112, and object to be treated 114 that is placed in plasma processing portion 112 is subjected to a surface treatment by said plasma 109. Also, a reactive gas is introduced as necessary through gas introduction system Gt connected to plasma processing portion 112, and the reactant gas and the plasma stream are exhausted by gas exhaust system Gh.

Plasma 109 ejected from plasma generating portion 102 is bent in the shape of a T by a magnetic field to a direction not facing plasma generating portion 102, and is flowed into plasma processing portion 112. At the position facing plasma generating portion 102, droplet collecting portion 120 is arranged, on which cathode material particles (droplets) 118, produced from the cathode as a byproduct at the time of generation of plasma 109, are sampled. Therefore, droplets 118 that are not affected by the magnetic field advance to droplet collecting portion 120 to be collected, and droplets 118 are prevented from infiltrating plasma processing portion 112. As a specific droplets collecting means, for example, an adhesion and collecting of droplets that do not arrive at the plasma processing portion, using a baffle set up in the plasma duct wall, is disclosed in the Japanese Patent Laid-Open No. 2002-105628 bulletin (Patent Document 2).

[patent document 1] Japanese Patent Laid-Open No. 2002-8893 bulletin

[patent document 2] Japanese Patent Laid-Open No. 2002-105628 bulletin

[non-patent document 1] P. J. Martin, R. P. Netterfield and T. J. Kinder, Thin Solid Films 193/194 (1990)77

DISCLOSURE OF THE INVENTION

Problems to be Solved by the Invention

In the conventional plasma arc processing apparatus shown in FIG. 12, droplets 118 not affected by said magnetic field are collected by droplet collecting portion 120, but there have been cases in which electrically charged droplets to which an electric charge has been given through an interaction with plasma 109 are guided into plasma processing portion 112 by the magnetic field. Furthermore, there have been cases in which droplets of small grain diameter that were not collected at droplet collecting portion 120 are guided into plasma processing portion 112 while reflecting on the wall surfaces. When droplets thus enter plasma processing portion 112, because the droplets adhere to the surface of the object to be treated, a problem arises such that the thin film formation on the surface of the object to be treated and the uniformity of surface reforming are lost, and the surface characteristic of object to be treated is worsened.

Also, as described previously, in the magnetic filter method described in Non-Patent Document 1, the plasma stream is bent by a curved magnetic field, in order to move said plasma efficiently to the plasma processing portion. Because of this, the electrically charged droplets and the minuscule droplets that contaminate the plasma stream are guided into the plasma processing portion without being removed, and cannot be prevented from colliding or adhering onto the surface of the object to be treated.

In the recent plasma film formation technology, film formation using various kinds of materials is done, but an improvement of film formation precision such as smoothness by the film formation equipment is demanded. Because the droplet adhesion strongly influences the film formation precision as described above, an improvement of the droplet removal efficiency in the plasma generating apparatus is considered to be necessary.

Therefore, the objective of the present invention is to provide a plasma generating apparatus that can more effectively remove droplets contaminating the plasma that is generated in a plasma generating apparatus, and makes it possible to plan an improvement of the surface treatment precision of film formation and others by a high purity plasma; and a plasma processing apparatus which does a plasma treatment by using the plasma generated by this plasma generating apparatus.

Means to Solve the Problem

The present inventors, in order to solve the above problem, upon arranging in the plasma advancing path a droplet removing portion that removes droplets produced as a byproduct from the cathode at the time of plasma generation, the relation between the configuration of the plasma advancing path and the plasma treatment condition (film formation rate) was inspected. In this verification experiment, the film formation rate (nm/sec) was determined in a film formation treatment in which a plasma exposure was done on 1 piece of substrate for 4 seconds. Substrates whose dimension was width d1 of 2.5 in (inch), length D2 of 2.5 in (inch), and thickness t of an arbitrary value were used. FIG. 11 shows the relation of the plasma transport distance with respect to the film formation rate. Throughout this specification, the plasma transport distance is defined as the total distance in which the plasma that is ejected by the plasma generating portion (target surface) arrives at the object to be treated (substrate) in the plasma processing portion.

A1 and A2 of FIG. 11 indicate, respectively, the case in which the plasma advancing path bent in the shape of a T that was shown in. FIG. 12 was used, and the case in which the curved plasma advancing path that was shown in Non-Patent Document 1 was used. Each plasma transport distance is 1440 mm, 1380 mm. The film formation rate with the T-shaped plasma advancing path of A1 is about 0.3 nm/sec, and the film formation rate with the curve plasma advancing path of A2 is about 0.6 nm/sec. From the above verification, it can be understood that the plasma transport distance influences the film formation rate. Here, FIG. 11 is understood by using the conversion formula of 1 nm/sec=10 A/sec.

For the normal film formation condition that is used for semiconductor substrates, a film formation rate greater than about 0.8 nm/sec is necessary. As for the adhered amount of droplets, less than 50 are preferable on a substrate with the size of 2.5 in (inch)×2.5 in (inch), but about 1000 droplets adhered in the case of the above verification. Considering that the plasma transport distance influences the film formation rate, it is expected that the film formation rate can be improved if the plasma transport distance in the plasma advancing path is shortened, but it was found out that a mere shortening of the straight-advancing pathway was accompanied by an increase in the quantity of intruding droplets.

Examining the above verification results intensively, the present inventors reached the understanding that by forming an inclination-type plasma advancing path in the middle of the plasma advancing path, and forming the plasma advancing path in a bent manner in three stages, the intrusion of droplets can be prevented more effectively, and a plasma treatment with a suitable film formation rate can be done, even if the entire plasma advancing path is shortened.

The first form of the present invention is a plasma generating apparatus, comprising a plasma generating portion that generates plasma from a target surface by a vacuum arc discharge under a vacuum environment, a plasma advancing path that advances the plasma generated by said plasma generating portion, and a droplet removing portion that removes cathode material particles (henceforth termed "droplets") produced as byproducts from the cathode at the generation time of the plasma while positioned on said plasma advancing path, where said droplet removing portion comprises a plasma advancing tube that is connected to said plasma generating portion, a first plasma advancing tube that is connected in a bent manner to said plasma advancing tube, a second plasma advancing tube that is connected at the end of said first plasma advancing tube so that it is inclinedly arranged at a predetermined bending angle with respect to the tube axis, a third plasma advancing tube that is connected in a bent manner at the finishing end of said second plasma advancing tube so that said plasma is exhausted from a plasma outlet, and the total length L for said plasma to arrive from said target surface to an object to be treated that is set up to satisfy 900 mm≤L≤1350 mm.

The second form of the present invention is the plasma generating apparatus of said first form, wherein said second plasma advancing tube is arranged geometrically at a position off the straight line of sight between the plasma outlet side of said first plasma advancing tube and the plasma outlet of said third plasma advancing tube.

The third form of the present invention is the plasma generating apparatus of said second form, wherein $\theta \geq \theta_0$ is satisfied when the angle of elevation with respect to the line from the tube cross section top end at the plasma entrance port side of said third plasma advancing tube to the tube cross section bottom end at the plasma outlet side of said first plasma advancing tube is defined as $\theta$, and the angle of elevation with respect to the line from the tube cross section bottom end at the plasma outlet side of said third plasma advancing tube to the tube cross section top end at the plasma outlet side of said second plasma advancing tube is defined as $\theta_0$.

The fourth form of the present invention is the plasma generating apparatus of said first, second, or third form, wherein a magnetic field generating means for plasma transportation is established for generating a magnetic field for plasma transportation in each of said plasma advancing tube, said first plasma advancing tube, said second plasma advancing tube, and said third plasma advancing tube, a deflection magnetic field generating means for deflecting said magnetic field for plasma transportation is installed in said first plasma advancing tube and/or said second plasma advancing tube, and a plasma stream is deflected to the tube center through the deflection magnetic field generated by said deflection magnetic field generating means.

The fifth form of the present invention is the plasma generating apparatus of said fourth form, wherein said deflection magnetic field generating means comprises a yoke that is arranged at the outer circumference of said first plasma advancing tube and/or said second plasma advancing tube, and a magnetic field coil wound around said yoke, said yoke being adjusted by sliding along the tube axis direction, rotating along the circumferential direction, and/or swinging toward the tube axis direction.

The sixth form of the present invention is the plasma generating apparatus of said fourth form, wherein said magnetic field generating means for plasma transportation comprises a magnetic field coil that is wound around the outer tube circumference of each of said plasma advancing tube, said first plasma advancing tube, said second plasma advancing tube, and said third plasma advancing tube.

The seventh form of the present invention is the plasma generating apparatus of said sixth form, wherein the magnetic field coil that is wound around the outer tube circumference of said second plasma advancing tube comprises a magnetic field coil that is wound elliptically against the outer tube circumference along the inclination axis.

The eighth form of the present invention is the plasma generating apparatus of any one of said first to seventh forms, wherein a droplet collecting plate is implanted on the inner tube wall surface of each of said plasma advancing tube, said first plasma advancing tube, said second plasma advancing tube, and said third plasma advancing tube, and said implanting area is greater than or equal to 70% of the inner tube wall surface area.

The ninth form of the present invention is the plasma generating apparatus of any one of said first to eighth forms, wherein said second plasma advancing tube is set up as a radially enlarged tube, said first plasma advancing tube is set up as an introduction side radially reduced tube that is connected at the starting end on the plasma introduction side of said radially enlarged tube, and said third plasma advancing tube is set up as a discharge side radially reduced tube that is connected at the finishing end on the plasma discharge side of said radially enlarged tube.

The tenth form of the present invention is the plasma generating apparatus of any one of said first to ninth forms, wherein a rectification magnetic field generating means that converge and rectify a plasma stream that is supplied from said second plasma advancing tube to said third plasma advancing tube in the advancing direction and/or a deflection oscillating magnetic field generating means that deflects and oscillates said plasma stream in the cross-sectional direction is set up in the connecting portion between said second plasma advancing tube and said third plasma advancing tube.

The eleventh form of the present invention is the plasma generating apparatus of said eighth form, wherein the droplet collecting plate implanted in said second plasma advancing tube is shielded electrically from the tube wall of said second plasma advancing tube, and a bias voltage application means for applying a bias voltage to said droplet collecting plate is installed.

The twelfth form of the present invention is the plasma generating apparatus of any one of said first to eleventh forms, wherein one or more apertures whose installation position can be varied along the tube axis direction are set up in said second plasma advancing tube, and said aperture has an opening with a predetermined area.

The thirteenth form of the present invention is a plasma processing apparatus, comprising the plasma generating apparatus of any one of said first to twelfth forms and a plasma processing portion in which an object to be treated is installed, where the plasma outlet of said third plasma advancing tube is connected to a plasma introduction port of said plasma processing portion.

Effects of the Invention

According to the first form of the present invention, a plasma generating apparatus can be offered, in which the droplet removing portion that is set up in said plasma advancing path comprises a plasma advancing tube that is connected to said plasma generating portion, a first plasma advancing tube that is connected in a bent manner to said plasma advancing tube, a second plasma advancing tube that is connected at the end of said first plasma advancing tube so that it is inclinedly arranged at a predetermined bending angle with respect to the tube axis, and a third plasma advancing tube that is connected in a bent manner at the finishing end of said second plasma advancing tube so that said plasma is exhausted from a plasma outlet, and the total length L for said plasma to arrive from said target surface to an object to be treated that is set up to satisfy 900 mm≤L≤1350 mm. Furthermore in detail, said total length L is defined as the total length in which length L0 from the target surface to the outlet of said plasma advancing tube, length L1 of said first plasma advancing tube, length L2 of said second plasma advancing tube, length L3 of said third plasma advancing tube, and effective distance L4 for the plasma to arrive from the plasma outlet of said third plasma advancing tube to the object to be treated are added. That is to say, it is defined as L=L0+L1+L2+L3+L4, and the detail is shown in FIG. 1. As thus described, because said total length L is set so that 900 mm≤L≤1350 mm is satisfied, the film formation rate can be improved by shortening the plasma transport distance through the plasma advancing path compared to the conventional T-shaped and curved plasma advancing paths as shown in FIG. 11, and moreover, straight advancing pathway is not merely shortened, but droplets are removed with high efficiency by said bending of the path in three stages, and a high purity plasma that can realize an improvement of the surface treatment precision of the film formation can be generated.

Said second plasma advancing tube is inclined by said bending angle (angle of inclination), and when the angle of inclination is large, droplets can be blocked, but the deposition rate to the surface of the object to be treated decreases because the plasma density decreases. On contrary, when the angle of inclination is small, droplets intrude the treatment chamber, but the film formation rate on the surface of the object to be treated does not decrease because the fall of the plasma density is small. Therefore, said angle of inclination can be chosen appropriately from the relation between the deposition rate and the tolerance for droplets.

In the present invention, said bent pathway of said plasma advancing tube, said first plasma advancing tube, said second plasma advancing tube, and said third plasma advancing tube in three stages is comprised by connecting each tube on the same plane or by arranging spatially in three dimensions.

According to the second form of the present invention, because said second plasma advancing tube is arranged geometrically in a position off the straight line of sight from the plasma outlet of said third plasma advancing tube to the plasma outlet side of said first plasma advancing tube, the droplets that are led out by said first plasma advancing tube collide on the pathway inner wall and are adhered and removed during said bent pathway process in three stages without being exhausted directly by the plasma outlet of said third plasma advancing tube. Because of this, droplets adhering to the object to be treated can be largely reduced, and a plasma treatment by high purity plasma from which droplets have been highly efficiently removed becomes possible.

The outlet of said third plasma advancing tube may be connected directly to the outer wall surface of the plasma processing portion described below, or it may be arranged by being inserted within said outer wall surface. Furthermore, while maintaining the positional relation between the outlet of said third plasma advancing tube and said outer wall surface, a rectifying tube and/or a deflection/oscillation tube can be placed between the second plasma advancing tube and the third plasma advancing tube, as in the tenth form described below.

According to the third form of the present invention, $\theta \geq \theta_0$ is satisfied when the angle of elevation with respect to the line from the tube cross section top end at the plasma entrance port side of said third plasma advancing tube to the tube cross section bottom end at the plasma outlet side of said first plasma advancing tube is defined as $\theta$, and the angle of elevation with respect to the line from the tube cross section bottom end at the plasma outlet side of said third plasma advancing tube to the tube cross section top end at the plasma outlet side of said second plasma advancing tube is defined as $\theta_0$. Because of this, said second plasma advancing tube can arranged geometrically in a position off the straight line of sight from the plasma outlet of said third plasma advancing tube to the plasma outlet side of said first plasma advancing tube. Therefore, for example, in cases where the configuration is such that said bent pathway of three stages is connected on a same plane, a tube passage configuration can be realized in which the droplets that are led out from said first plasma advancing tube are not exhausted directly from the plasma outlet of said third plasma advancing tube, and a plasma treatment can be done using a high purity plasma from which droplets were removed highly efficiently.

As explained above, it goes without saying that the outlet of said third plasma advancing tube may be connected directly to the outer wall surface of the plasma processing portion described below, or it may be arranged by being inserted inside of said outer wall surface. Also, it goes without saying that a rectifying tube and/or a deflection/oscillation tube may be placed between the second plasma advancing tube and the third plasma advancing tube.

According to the fourth form of the present invention, a magnetic field generating means for plasma transportation is established for generating a magnetic field for plasma transportation in each of said plasma advancing tube, said first plasma advancing tube, said second plasma advancing tube, and said third plasma advancing tube, a deflection magnetic field generating means for deflecting said magnetic field for plasma transportation is installed in said first plasma advancing tube and/or said second plasma advancing tube, and a plasma stream is deflected to the tube center through the deflection magnetic field generated by said deflection magnetic field generating means. Because of this, a heterogeneity of said magnetic field for plasma transportation in the connecting section in said first plasma advancing tube and/or said second plasma advancing tube, that is to say, an inconvenience that the additional magnetic field inside the bending portion becomes strong due to the configuration of said magnetic field coil for magnetic field generation for plasma transportation, is deflected and adjusted by said deflection magnetic field, the plasma density is kept high by guiding the plasma stream to the tube passage center, and a plasma treatment using a highly dense, highly pure plasma can be done.

According to the fifth form of the present invention, said deflection magnetic field generating means comprises a yoke that is arranged at the outer circumference of said first plasma advancing tube and/or said second plasma advancing tube, and a magnetic field coil wound around said yoke, said yoke being adjusted by sliding along the tube axis direction, rotating along the circumferential direction, and/or swinging toward the tube axis direction. Because of this, a cancellation of a heterogeneity in the magnetic field for said plasma transportation can be attempted by making a fine adjustment by said deflection magnetic field through the movement of said yoke, and an optimum plasma advancing path comprising the geometrical arrangement of three stages of said bent pathway can be realized.

According to the sixth form of the present invention, said magnetic field generating means for plasma transportation comprises a magnetic field coil that is wound around the outer tube circumference of each of said plasma advancing tube, said first plasma advancing tube, said second plasma advancing tube, and said third plasma advancing tube. Because of this, a plasma treatment using highly dense and highly pure plasma can be done through improving the plasma transport efficiency by generating said magnetic field for plasma transportation in the entirety of said bent pathway in three stages.

When said magnetic field coil for magnetic field generation for plasma transportation is set up by winding in circle along the inclination axis around said diagonally arranged second plasma advancing tube, a gap is produced in the vicinity of the connecting section with another tube where the coil is not wound, an uneven magnetic field is produced, and the plasma transport efficiency falls. Therefore, according to the seventh form of the present invention, because the magnetic field coil that is wound around the outer tube circumference of said second plasma advancing tube comprises a magnetic field coil that is wound around in oval around the outer tube circumference with respect to the inclination axis, by densely winding the magnetic field coil around the inclined surface of said second plasma advancing tube without producing the concerning gap, the plasma transport efficiency can be improved without producing an uneven magnetic field, and a plasma treatment with the use of highly dense and highly pure plasma can be done.

According to the eighth form of the present invention, because a droplet collecting plate is implanted on the inner tube wall surface of each of said plasma advancing tube, said first plasma advancing tube, said second plasma advancing tube, and said third plasma advancing tube, and said implanting area is greater than or equal to 70% of the inner tube wall surface area, the scattered droplets can be adhered and collected reliably in a large quantity, and a high purification of plasma stream can be realized, by increasing the droplet adhesion surface area in the tubes for the plasma advancing path.

According to the ninth form of the present invention, because said second plasma advancing tube is set up as a radially enlarged tube, said first plasma advancing tube is set up as an introduction side radially reduced tube that is connected at the starting end on the plasma introduction side of said radially enlarged tube, and said third plasma advancing tube is set up as a discharge side radially reduced tube that is connected at the finishing end on the plasma discharge side of said radially enlarged tube, the plasma stream that is introduced from said introduction side radially reduced tube into said radially enlarged tube is diffused by the diameter-increasing effect of said plasma advancing path due to said radially enlarged tube. Because the droplets that contaminate the plasma are also diffused in said radially enlarged tube by the diffusion of this plasma stream, they collide with the internal side wall of said radially enlarged tube, and are adhered and collected. Also, when the plasma stream in said radially enlarged tube is exhausted, the droplets which scattered to the inner wall surface side of said radially enlarged tube collide with the step portion through the diameter-decreasing effect from said radially enlarged tube to said discharge side radially reduced tube, and are adhered and collected without merging into the plasma stream. Thus, a re-mixture of the droplets can be prevented. Therefore, the droplets can be made to adhere to the internal side wall of said radially enlarged tube and collected sufficiently. Thus, the droplets can be removed efficiently in the tube passage of said first plasma advancing tube, said second plasma advancing tube, and said third plasma advancing tube. Also, if the central axes of the radially enlarged tube and the introduction side radially reduced tube and/or the discharge side radially reduced tube are made not co-centric but instead eccentric, the droplets become easier to separate from the plasma stream, and the collecting effect of the droplets increases even more. Moreover, a droplet removing portion can be constituted easily and cheaply by merely forming said radially enlarged tube in said plasma advancing path, and furthermore, the surface treatment precision of film formation can be improved, and the surface reforming of the object to be treated and the uniformity of the formed film can be improved markedly, by means of the high purity plasma obtained by the improvement of the droplet removal efficiency.

There are cases where the plasma stream meanders or diffuses in the connecting section with said third plasma advancing tube, located at the finishing end of said diagonally arranged second plasma advancing tube. Because of this, a plasma rectifying tube may be arranged in the outlet of said second plasma advancing tube, and a rectification magnetic field generating means that forcibly converge and rectify the plasma stream in the advancing direction may be set up at the outer circumference of this plasma rectifying tube. When the convergence magnetic field is applied in the plasma advancing direction, the plasma stream that had been meandering and diffusing can be advanced while being converged forcibly. Also, a deflection/oscillation magnetic field that oscillates the plasma stream left and right (or up and down) in the cross sectional direction can be formed inside the deflection/oscillation tube, by arranging a bell mouth-shaped deflection/oscillation tube in the outlet of said plasma rectifying tube, and arranging a deflection/oscillation magnetic field generator (that is to say, a yoke coil) at the outer circumference of said deflection/oscillation tube. Scanning a plasma stream in wide range becomes possible, if it is deflected and oscillated in both the left-right direction (the cross-section X-axis direction) and the top-bottom direction (the cross-section Y-axis direction). As thus described, by deflecting and scanning the plasma stream, it becomes possible to increase and decrease the plasma exposure area at will in cases where the irradiation area to the yet-to-be-processed object is larger than the plasma stream cross section area. Needless to say, said plasma rectifying tube and said deflection/oscillation tube may be placed together and arranged, or they may be arranged individually.

According to the eleventh form of the present invention, because the droplet collecting plate implanted in said second plasma advancing tube is shielded electrically from the tube wall of said second plasma advancing tube, and a bias voltage application means for applying a bias voltage to said droplet collecting plate is installed, said bias voltage is applied to said droplet collecting plate. Therefore, by adjusting its bias electric potential, attenuation of the plasma can be suppressed, and it becomes possible to increase the plasma transportation efficiency. As for the applied voltage, there is a case that it is positive, and a case that it is negative. The application configuration is chosen suitably. In a case where the electric potential is positive, positive ions repel and are pushed in the transportation direction. In a case where the electric potential is negative, electrons repel and are pushed in a transportation direction. Whether the positive or the negative electric potential is applied is chosen so as to increase the plasma transportation efficiency. Also, the magnitude of the electric potential is adjusted in a varying degree, and an electric potential strength that increases the plasma transportation efficiency is chosen.

According to the twelfth form of the present invention, one or more apertures whose installation position can be varied along the tube axis direction are set up in said second plasma advancing tube, and said aperture has an opening with a predetermined area. Because of this, droplets are collected by reducing said second plasma advancing tube in diameter through said aperture, and moreover, the quantity of collecting can be adjusted optimally by changing the installation position, contributing to an improvement of the droplet removal efficiency. By the way, said opening not only can be set up in the center of said aperture, but also in an eccentric position, giving it a function to make the plasma stream in the tube meander.

According to the thirteenth form of the present invention, it comprises the plasma generating apparatus of any one of the first to twelfth form and a plasma processing portion in which an object to be treated is installed, where the plasma outlet of said third plasma advancing tube is connected to a plasma introduction port of said plasma processing portion. Because of this, providing of a plasma processing apparatus becomes possible, in which highly pure plasma generated by said plasma generating apparatus equipped with a plasma advancing path comprising three stages of said bent pathway is introduced from said plasma introduction port and irradiated on the object to be treated, thereby making it possible to improve the surface treatment precision of the film formation, and thus to improve markedly the surface reforming of the surface of the object to be treated and the uniformity of the formation film. Just as stated above, the connection may be designed freely. For example, the plasma outlet of said third plasma advancing tube may be connected to the outer wall surface of said plasma processing portion, or it may be inserted deeply into the inside of said outer wall surface.

DENOTATIONS OF REFERENCE NUMERALS

Figure 1:
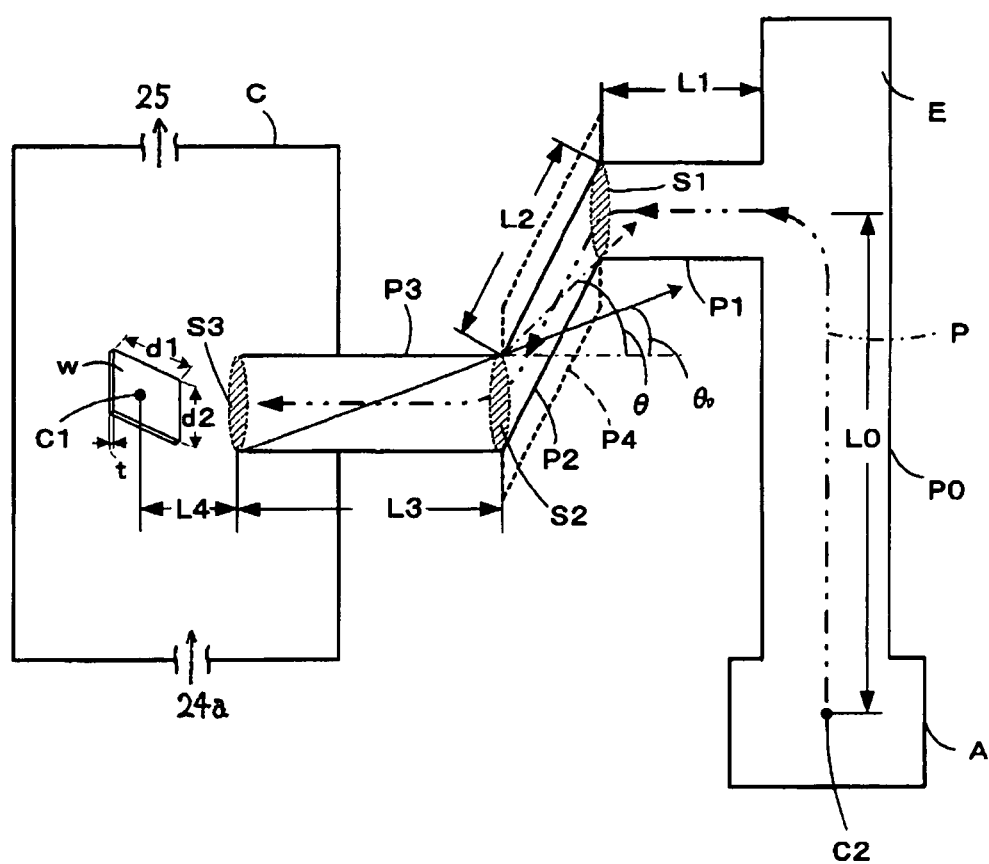
FIG. 1 is a summary configuration diagram of the plasma generating apparatus concerning the first embodiment of the present invention.

1 Plasma processing portion
2 Plasma generating portion
3 Plasma advancing tube
4 First plasma advancing tube
5 Second plasma advancing tube
6 Third plasma advancing tube
7 Plasma outlet
8 Arrow
9 Arrow
10 Cathode
11 Trigger electrode
12 Anode
13 Arc power supply
14 Cathode protector
15 Plasma stabilizing magnetic field generator
16 Insulation plate
17 Magnetic field coil
18 Magnetic field coil
19 Magnetic field coil
20 Magnetic field coil
21 Magnetic field coil
22 Deflection magnetic field generating means
23 Magnetic field coil
24 Deflection magnetic field generating means
24a Gas inflow port
25 Exhaust port
27 Magnetic pole
28 Magnetic pole
29 Movable yoke
30 Deflection magnetic field generating coil
31 Guiding body
32 Guiding groove
33 Pin
34 Fastening nut
35 Slide member
36 Spacer
37 Main body of adjusting section
38 Slide groove
39 Pin
40 Fastening nut
41 Droplet collecting plate (baffle)
42 Droplet collecting plate (baffle)
43 Droplet collecting plate (baffle)
44 Droplet collecting plate (baffle)
60 Droplet collecting plate (a part of baffle)
61 Inner circumferential tube
62 Opening
63 Bias power supply
70 Aperture
71 Opening
71 Stopper
73 Screw
74 Protrusion
75 Tube
76 Engagement recess
77 Arrow
108a X-direction oscillating magnetic field generator
108b Y-direction oscillating magnetic field generator
1109 Outlet tube
102 Plasma generating portion
104 Cathode
106 Trigger electrode
108 Anode
109 Plasma
1110 Power supply
112 Plasma processing portion
114 Object to be treated
116a Plasma stabilizing magnetic field generator
116b Plasma stabilizing magnetic field generator
1100 Plasma advancing tube
1101 First plasma advancing tube
1102 Second plasma advancing tube
1103 Third plasma advancing tube
1104 Connecting port
1105 Plasma outlet
1106 Plasma outlet
1107 Rectifying tube
1108 Frustoconical tube
1110 Plasma outlet
1111 Arrow
1112 Arrow
1113 Magnetic field coil for scanning
1114 Rectifying magnetic field coil
A Plasma generating portion
C Plasma processing portion
C1 Installation position
C2 Target position
P0 Plasma advancing tube
P1 First plasma advancing tube
P2 Second plasma advancing tube
P3 Third plasma advancing tube
P4 Radially enlarged tube
S1 Plasma outlet
S2 Plasma entrance port
S3 Plasma outlet
W Work

BEST MODE FOR CARRYING OUT THE INVENTION

In the following, the embodiments of the plasma generating apparatus concerning the present invention are explained in detail based on the attached drawings.

Figure 2:
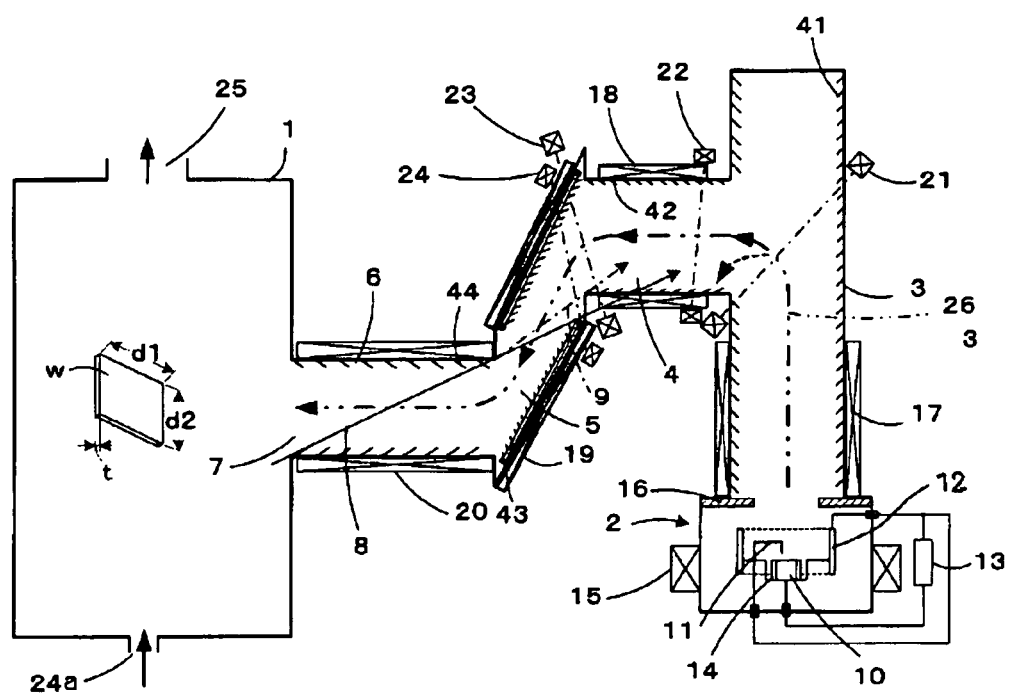
FIG. 2 is a summary configuration diagram of the plasma processing apparatus concerning the second embodiment of the present invention.

FIG. 1 is a summary configuration diagram of the plasma generating apparatus concerning the present invention. The plasma generating apparatus shown in the figure comprises plasma generating portion A that generates plasma that is supplied to plasma processing portion (chamber) C, and a plasma advancing path. Work (object to be plasma-treated) W is set up in plasma processing portion C, a reactive gas is introduced as necessary from gas inflow port 24a by a gas introduction system connected inside the chamber, and the reactant gas and the plasma stream are exhausted from exhaust port 25 by a gas exhaust system. Plasma generating portion A has a cathode (a target) in which plasma is generated by vacuum arc discharge under a vacuum environment. The plasma advancing path comprises a tube passage that circulates plasma. A droplet removing portion that removes droplets produced as a byproduct from the cathode is arranged in the plasma advancing path. This droplet removing portion is also a plasma circulation tube passage, and it comprises plasma advancing tube P0 that is connected to plasma generating portion A, first plasma advancing tube P1 that is connected in a bent manner to plasma advancing tube P0, second plasma advancing tube P2 that is inclinedly arranged and connected at the end of first plasma advancing tube P1 in a predetermined bending angle with respect to the tube axis, and third plasma advancing tube P3 that is connected in a bent manner at the end of second plasma advancing tube P2 so that the plasma is exhausted from the plasma outlet. Outlet S3 of said third plasma advancing tube P3 is inserted deeply and extended into the inside of the outer wall surface of said plasma processing portion C. However, as shown in FIG. 2 described below, said outlet S3 may be directly connected to said outer wall surface through a flange (not shown). The connection type can be chosen freely as described such or otherwise.

Plasma advancing tube P0 adheres and removes droplets advancing straightly from plasma generating portion A, by colliding them against end portion E facing plasma generating portion A or the tube wall. The plasma advancing length from said target position C2 of plasma generating portion A to the outlet of plasma advancing tube P0, that is to say, to the connection point between plasma advancing tube P0 and first plasma advancing tube P1, is defined as L0. First plasma advancing tube P1 communicates and is connected in a perpendicular direction to the finishing end side wall of plasma advancing tube P0. The plasma advancing length of first plasma advancing tube P1 is defined as L1. Second plasma advancing tube P2 is inclinedly arranged between first plasma advancing tube P1 and third plasma advancing tube P3, and its plasma advancing length is defined as L2. Third plasma advancing tube P3 is arranged in a parallel direction to first plasma advancing tube P1, and its plasma advancing length is defined as L3. The plasma outlet of third plasma advancing tube P3 is extended to the inside of plasma processing portion C. The plasma effective distance in which the plasma that is exhausted from the plasma outlet of third plasma advancing tube P3 arrives at installation position C1 of the object to be treated in plasma processing portion C is defined as L4. The plasma advancing path is formed in a bent manner in three stages by plasma advancing tube P0, first plasma advancing tube P1, second plasma advancing tube P2 and third plasma advancing tube P3.

Around the outer circumference of each plasma advancing tube, a magnetic field coil (not shown) that generates a plasma transportation magnetic field for transporting plasma stream P along the tube passage is wound. The plasma transport efficiency is improved by generating a magnetic field for plasma transportation in the entire three stages of said bent paths through the magnetic field generating means for plasma transportation comprising the magnetic field coils. In addition, a baffle for droplet removal (not shown) is set up on the tube wall.

Figure 11:
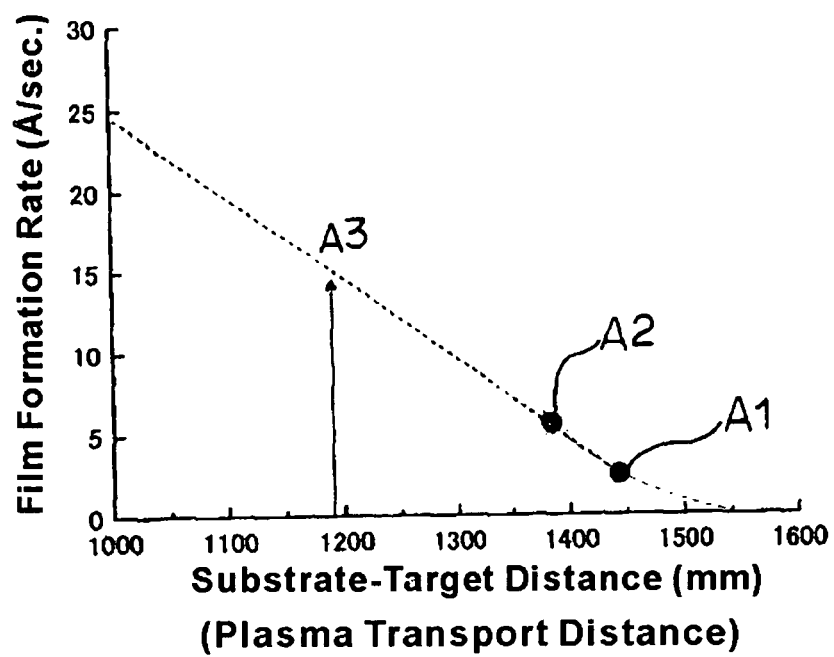
FIG. 11 is a figure showing the relation of the plasma transport distance with respect to the film formation rate.
Figure 12:
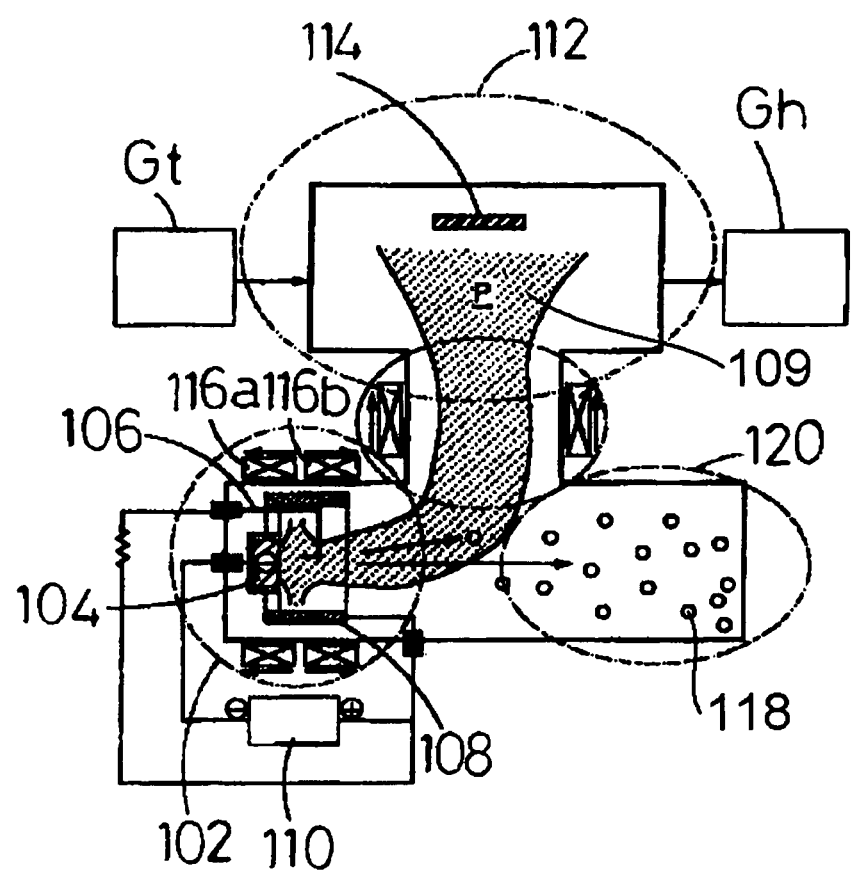
FIG. 12 is a schematic configuration diagram of a conventional plasma arc processing apparatus.

In the plasma advancing path concerning the above configuration, between the target surface and the outlet surface of plasma advancing tube P0, total length (plasma transport distance) L (=L0+L1+L2+L3+L4) in which plasma effective distance L4 is added to plasma advancing length L0-L3 of each of first plasma advancing tube P1, second plasma advancing tube P2 and third plasma advancing tube P3 is set to satisfy 900 mm≤L≤1350 mm. In the present embodiment, L is set to be 1190 mm, as shown in A3 of FIG. 11. When plasma was exposed on 1 piece of substrate under this setting of the plasma transport distance, in the same manner as said verification experiment of A1 and A2, and film formation of 3 nm thickness was carried out, a film formation rate of about 1.5 nm/sec was obtained.

According to the present embodiment, the film formation rate can be improved by shortening the plasma transport distance in said plasma advancing path further than the conventional T-shaped plasma advancing path or the curve plasma advancing path. Moreover, by said bending of the pathway in three stages instead of a mere shortening a straight pathway, droplets are removed in a highly efficient manner, and high purity plasma that can realize an improvement of the surface treatment precision of the film formation can be generated. That is to say, the plasma transport distance is shortened in comparison with the case of a plasma advancing path bent in a T-shape (A1) and the case of a curved plasma advancing path (A2). Moreover, a high film formation rate (about 1.5 nm/sec) can be obtained as a good film formation condition used for semiconductor substrates and such.

In the present embodiment, the plasma advancing path comprises said bent pathway of three stages, and furthermore, an extremely good droplet removal effect is obtained by the tube passage placement shown in FIG. 1. When plasma was irradiated for 4 seconds on substrates (works W) of the dimension where width d1 was 2.5 in (inches), length D2 was 2.5 in (inches), and thickness t was arbitrary, the droplets deposited was less than 10-100 because of this droplet removal effect.

Second plasma advancing tube P2 is arranged geometrically in a position away from the straight line of sight from plasma outlet S3 of third plasma advancing tube P3 to plasma outlet S1 side of first plasma advancing tube P1. That is to say, when the angle of elevation with respect to the line from the tube cross section top end at the plasma entrance port S2 side of third plasma advancing tube P3 to the tube cross section bottom end at the plasma outlet S1 side of first plasma advancing tube P1 is defined as θ, and the angle of elevation with respect to the line from a tube cross section bottom end at the plasma outlet S3 side of third plasma advancing tube P3 to the tube cross section top end at the plasma outlet S2 side of second plasma advancing tube P2 is defined as $θ_0$, $θ≥θ_0$ is satisfied.

By the above geometric tube passage placement, a direct intrusion into third plasma advancing tube P3 of straight-advancing droplets entering from first plasma advancing tube P1 is prevented, so that they would not be exhausted from plasma outlet S3 of third plasma advancing tube P3. Therefore, in said three-stage bent pathway process, it becomes possible to adhere and remove droplets by making them collide with the pathway wall. As discussed above, the deposited amount of droplets on the object to be treated can be greatly reduced, and a plasma treatment by high purity plasma from which droplets have been removed with high efficiency can be carried out.

In this embodiment, said three-stage bent pathway is formed by connecting on a same plane. However, even when the tube passage configuration is a spatial bending in three stages, a tube passage configuration in which straight-advancing plasma is not directly exhausted from the plasma outlet of third plasma advancing tube can be realized by a similar geometry to the above.

As shown by the broken line, second plasma advancing tube P2 may be in a form of radially enlarged tube P4 whose inside diameter is larger than first plasma advancing tube P1 and third plasma advancing tube P3. That is to say, second plasma advancing tube P2 is made into radially enlarged tube P4, first plasma advancing tube P1 is made into an introduction side radially reduced tube connected to the plasma introduction side starting end of radially enlarged tube P4, and third plasma advancing tube P3 is made into a discharge side radially reduced tube connected to the plasma discharge side finishing end of radially enlarged tube P4. If radially enlarged tube P4 is arranged in the middle, the plasma stream which was introduced into the radially enlarged tube from the introduction side radially reduced tube is diffused by the diameter-increasing effect of the plasma advancing path by radially enlarged tube P4. By the diffusion of this plasma stream, the droplets that are mixed into the plasma diffuse into radially enlarged tube P4, collide with the inner side wall of radially enlarged tube P4, and thus are adhered and collected. In addition, when the plasma stream in radially enlarged tube P4 is exhausted, the droplets that were scattered in the radially enlarged tube inner wall surface side collide with the stage step through the diameter decreasing effect from radially enlarged tube P4 to the discharge side radially reduced tube, and are adhered and collected without rejoining the plasma stream, thereby preventing a re-mixture of the droplets. Therefore, droplets can be adhered to the inner side wall of radially enlarged tube P4 and collected sufficiently, and droplets can be removed efficiently in the tube passage of first plasma advancing tube P1, second plasma advancing tube P2, and third plasma advancing tube P3. In addition, when the central axes of radially enlarged tube P4 and the introduction side radially reduced tube and/or the discharge side radially reduced tube are not made co-centric but instead are set off eccentrically, droplets become easier to separate from the plasma stream, and the trapping effect on droplets are enhanced further. Moreover, just by forming radially enlarged tube P4 in the plasma advancing path, a droplet removing portion can be constructed easily and cheaply.

Next, an installation example of magnetic field coils suitable for a plasma processing apparatus in which the plasma generating apparatus in the present invention was used, and an installation example of baffle for droplet removal (collecting plates) are explained.

In FIG. 2, an embodiment of plasma processing apparatus is shown, in which a magnetic field coil which generates a magnetic field for plasma transportation is set up at the outside circumference, and in addition, baffles for droplet removal are set up on the inner tube wall. In this embodiment, the connection configuration in which the outlet of the third plasma advancing tube is directly connected to the outer wall surface of plasma processing portion 1 is adopted.

The plasma processing apparatus of FIG. 2 comprises plasma processing portion (chamber) 1, and a plasma generating apparatus comprising plasma generating portion 2 that generates the plasma supplied to plasma processing portion 1 and a plasma advancing path. The plasma advancing, path comprises a plasma stream tube passage in which a droplet removing portion that removes droplets has been set up, in a similar manner to the case FIG. 1. The droplet removing portion comprises plasma advancing tube 3 connected to plasma generating portion 2, first plasma advancing tube 4 connected in a bent manner to plasma advancing tube 3, second plasma advancing tube 5 connected at the end of first plasma advancing tube 4 by being inclinedly arranged in a predetermined bending angle with respect to its tube axis, and third plasma advancing tube 6 connected in a bent manner at the end of second plasma advancing tube 5 so that plasma is exhausted from plasma outlet 7.

The plasma advancing path comprising plasma advancing tube 3, first plasma advancing tube 4, second plasma advancing tube 5, and third plasma advancing tube 6 is formed in a bent manner in three stages, in the same manner as the plasma advancing path of FIG. 1. Plasma outlet 7 of third plasma advancing tube 6 is connected to the plasma introduction port of plasma processing portion 1.

In addition, second plasma advancing tube 5 is geometrically arranged in a position away from the straight line of sight from plasma outlet 7 of third plasma advancing tube 6 to the plasma outlet side of first plasma advancing tube 4, in the same manner as FIG. 1. That is to say, as indicated with arrow 9, the angle of elevation ($\theta$) with respect to the line from the tube cross section top end at the plasma entrance port side of third plasma advancing tube 6 to the tube cross section bottom end at the plasma outlet side of first plasma advancing tube 4 satisfies $\theta \geq \theta_0$ when the angle of elevation with respect to the line from the tube cross section bottom end at the plasma outlet 7 side of third plasma advancing tube 6 to the tube cross section top end at the plasma outlet side of second plasma advancing tube 5 is defined as ($\theta 0$), as indicated with arrow 8.

By the same geometric placement of the tube passage as FIG. 1, a direct intrusion into third plasma advancing tube 6 of the straight-advancing droplets that are led out from first plasma advancing tube 4 is prevented, so that they are not exhausted from plasma outlet 7 of third plasma advancing tube 6.

Plasma generating portion 2 comprises cathode 10, trigger electrode 11, anode 12, arc power supply 13, cathode protector 14, and plasma stabilizing magnetic field generator 15 (an electromagnetic coil or a magnet). Cathode 10 is the source of the plasma constituent matter, and its formation material is not limited in particular, as long as it is an electroconductive solid. A metal simple substance, an alloy, an inorganic simple substance, an inorganic compound (metallic oxide/nitride) and such can be used individually or by mixing two or more kinds. Cathode protector 14 electrically insulates except for the evaporating cathode surface, and it prevents the plasma generated between cathode 10 and anode 12 from diffusing backward. The formation material of anode 12 is not limited in particular, as long as it does not evaporate even at the plasma temperature, it is a nonmagnetic material, and it is an electroconductive solid. In addition, the configuration of anode 12 is not limited in particular, as long as it does not obstruct the overall progress of the arc plasma. Furthermore, plasma stabilizing magnetic field generator 15 is set up at the outer circumference of plasma generating portion 2, and it stabilizes the plasma. When arc stabilization field generator 15 is set up so that the applied magnetic fields on the plasma are in mutually opposite directions (cusp form), the plasma is stabilized furthermore. In addition, when arc stabilization magnetic field generator 15 is arranged so that the applied magnetic fields on the plasma are in a mutually same direction (mirror form), the deposition rate by the plasma can be improved further. Furthermore, plasma generating portion 2 and each plasma tube passage are electrically insulated by plasma generating portion side insulation plate 16. Thus, the portion forward of plasma advancing tube 3 is in an electrically floating condition even if a high voltage is applied to plasma generating portion 2, and it is set up so that the plasma is not electrically affected in the plasma advancing path. In addition, a processing portion side insulation plate (not shown) is placed between third plasma advancing tube 6 and plasma processing portion 1. Thus, the whole of the duct portion for plasma transportation from plasma advancing tube 3 to third plasma advancing tube 6 is set to an electrically floating state, and it is set up so that there is no influence by the external power supply (high voltage source or GND) on the transported plasma.

At plasma generating portion 2, plasma is generated by making an electric spark between cathode 10 and trigger electrode 11, and generating a vacuum arc between cathode 10 and anode 12. The constituent particles of this plasma include vaporized material from cathode 10 and charged particles (ions, electrons) originating from the vaporized material and the reactant gas, together with neutral particles of molecules and atoms in pre-plasma condition. In addition, at the same time as the plasma constituent particles are ejected, droplets with size of from less than submicron to several hundred microns (0.01-1000 µm) are ejected. These droplets form a mixed state with plasma stream 26, and move through the plasma advancing path as a droplet-mixed plasma.

In the plasma advancing path comprising plasma advancing tube 3, first plasma advancing tube 4, second plasma advancing tube 5, and third plasma advancing tube 6, a magnetic field generating means for plasma transportation comprising magnetic field coils 17, 18, 19, 20 wound around the outside circumference of each tube is set up. The plasma transport efficiency can be improved by generating a magnetic field for plasma transportation throughout the entire bent pathway of three stages.

Because the plasma advancing path is formed in a bent manner in three stages, magnetic field coils 21, 23 for generating a bending magnetic field in the tube connecting portion between first plasma advancing tube 4 and second plasma advancing tube 5 are installed, and guide the plasma stream in a bent manner by the bending magnetic field. Because the coil for bending magnetic fields cannot be wound evenly at the connecting portion between first plasma advancing tube 4 and second plasma advancing tube 5, a heterogeneity of the magnetic field is produced, in which the bending magnetic field becomes strong at the inside of the bend. To correct this heterogeneous magnetic field, deflection magnetic field generating means 22, 24 are provided in first plasma advancing tube 4 and second plasma advancing tube 5.

Figure 3:
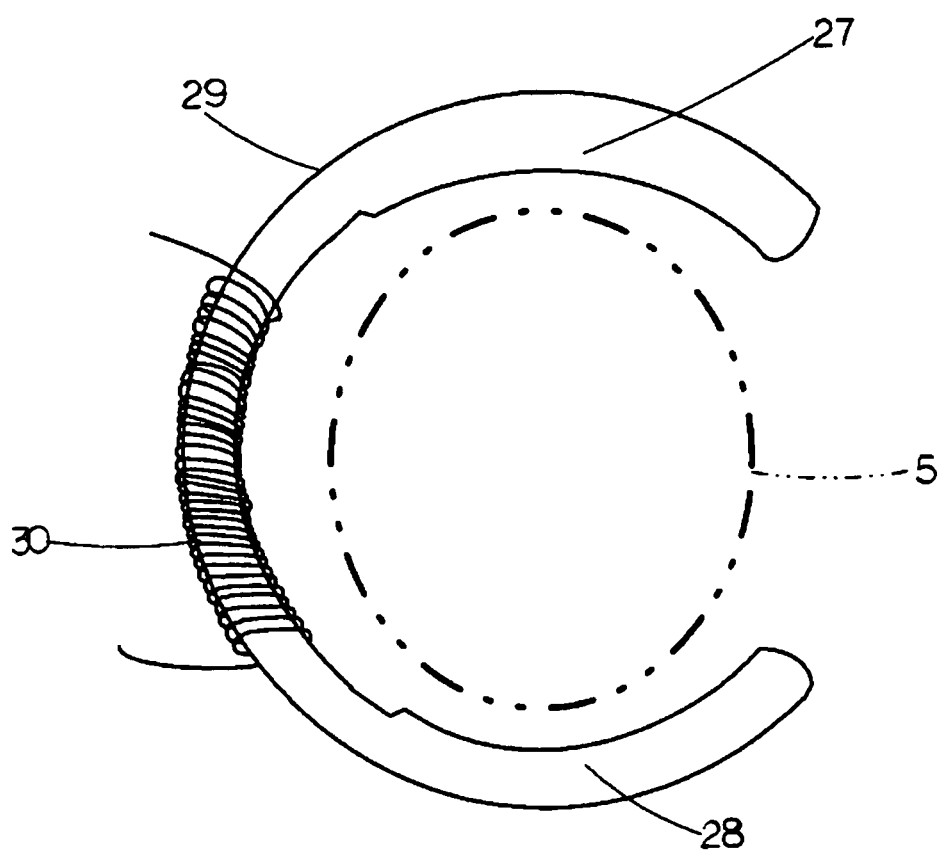
FIG. 3 is a figure showing the arrangement state of movable yoke 29 concerning the second embodiment.

Deflection magnetic field generating means 22, 24 comprise deflection magnetic field generating coil 30 and movable yoke 29. FIG. 3 shows a state in which movable yoke 29 is arranged around the outer circumference of second plasma advancing tube 5. As for movable yoke 29, deflection magnetic field generating coil 30 is wound around it, and it has a pair of magnetic poles 27, 28. A deflection magnetic field is generated between magnetic poles 27, 28, and it acts on the plasma in second plasma advancing tube 5.

Deflection magnetic field generating means 22, 24 include an adjustment mechanism in which movable yoke 29 is adjusted by sliding in the tube axis direction, rotating in the circumferential direction, and swinging toward the tube axis direction.

Figure 4:
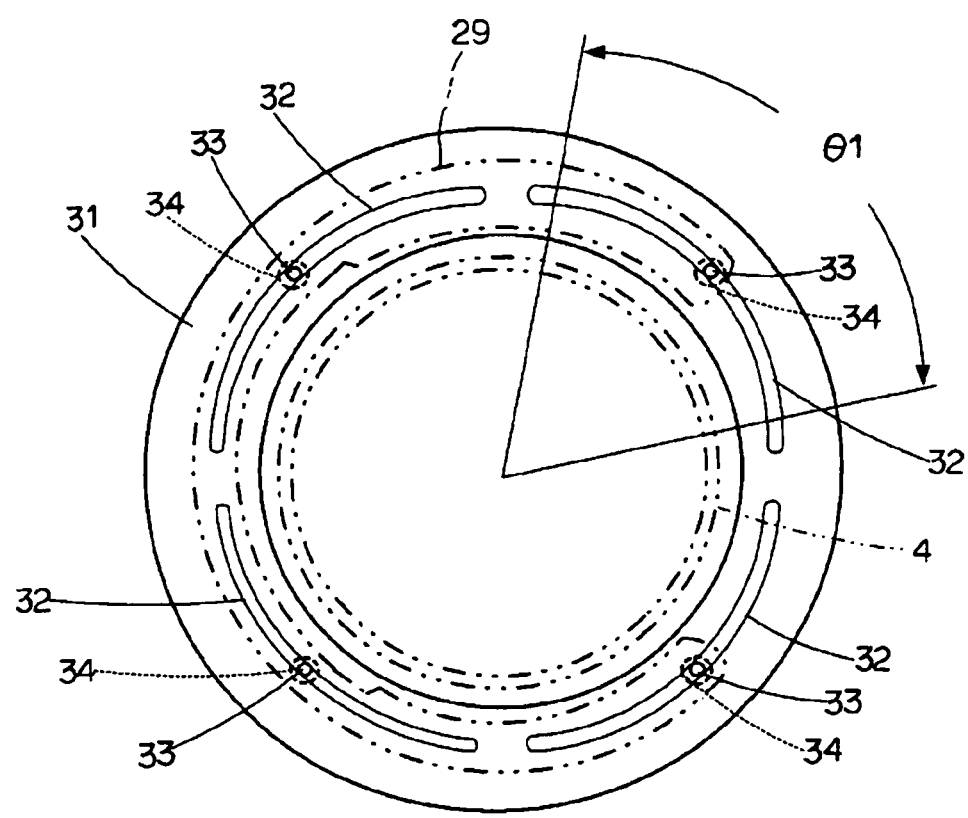
FIG. 4 is a configuration diagram showing the rotating adjustment mechanism of movable yoke 29.

FIG. 4 shows the rotating adjustment mechanism of movable yoke 29 arranged around the outer circumference of first plasma advancing tube 4. The rotating adjustment mechanism comprises guiding body 31, on which arc-like guiding grooves 32 are set up in four places for adjusting movable yoke 29 rotationally in the circumferential direction. Pin 33 that is set up on movable yoke 29 is inserted into guiding groove 32, and by making pin 33 slide along the tube circumferential direction, movable yoke 29 can be adjusted by pivoting within angle adjusting range θ1 of less than or equal to 90 degrees. After the adjustment, its adjustment angle can be maintained by tightening pin 33 to guiding body 31 with fastening nut 34.

Figure 5:
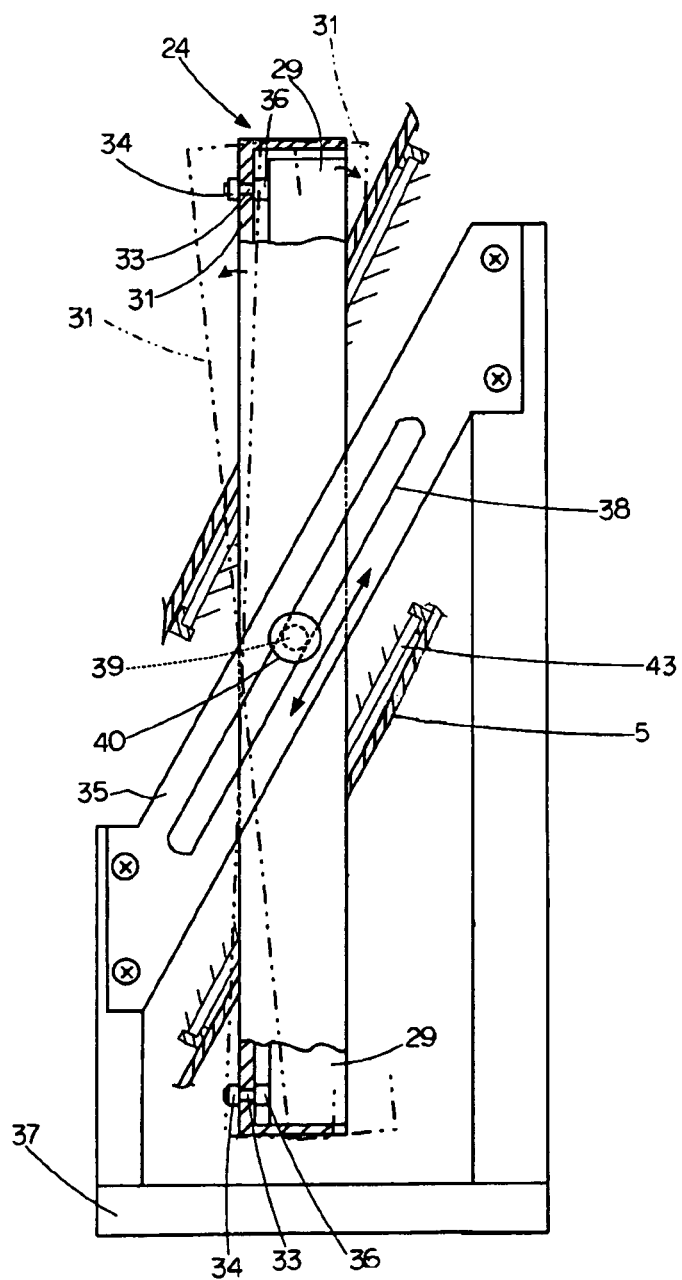
FIG. 5 is a configuration diagram showing the slide and swing adjustment mechanisms of movable yoke 29.

FIG. 5 shows an adjustment mechanism in which movable yoke 29 that is set up at the outer circumference of second plasma advancing tube 5 is adjusted by sliding along and swinging toward the tube axis direction. Guiding body 31 is supported onto slide member 35 in the state in which movable yoke 29 is held by being fixed through spacer 36. Slide member 35 has a straight slide groove 38 along the tube axis direction of second plasma advancing tube 5, and is fixed to the main body of adjusting section 37. Slide groove 38 is formed parallel to the inclined center line of second plasma advancing tube 5. The slide groove that is set up on first plasma advancing tube 4 is formed horizontally along the center line of first plasma advancing tube 4. Pin 39 that is set up on guiding body 31 is inserted into guiding groove 38, and by making pin 39 slide toward the tube axis direction, movable yoke 29 of guiding body 31 can be slide-adjusted over almost the entire tube length of second plasma advancing tube. After the adjustment, the adjustment position can be maintained by tightening pin 39 onto slide member 35 with fastening nut 40. In addition, guiding body 31 is supported by slide member 35 in a state were it fixes and holds movable yoke 29, and is free to rotate around the axis of pin 39. Movable yoke 29 can be swing-adjusted toward the tube axis direction (tilt angle adjustment) by rotating it around the axis circumference of pin 39. After the adjustment, the adjustment tilt angle can be maintained by tightening pin 39 to slide member 35 with fastening nut 40. The adjustable tilt angle is 5° toward the first plasma advancing tube 4 side, and 30° toward the other side.

Because deflection magnetic field generating means 22, 24 enable an adjustment of movable yoke 29 by sliding along the tube axis direction, rotating toward the circumferential direction, and swinging toward the tube axis direction, a removal of the heterogeneity in the magnetic field for plasma transportation can be done by carrying out a fine adjustment by said deflection magnetic field through an adjustment of the position or the angle of movable yoke 29, and an optimum plasma advancing path comprising the geometrical arrangement of said bent pathway in three stages can be realized.

Figure 6:
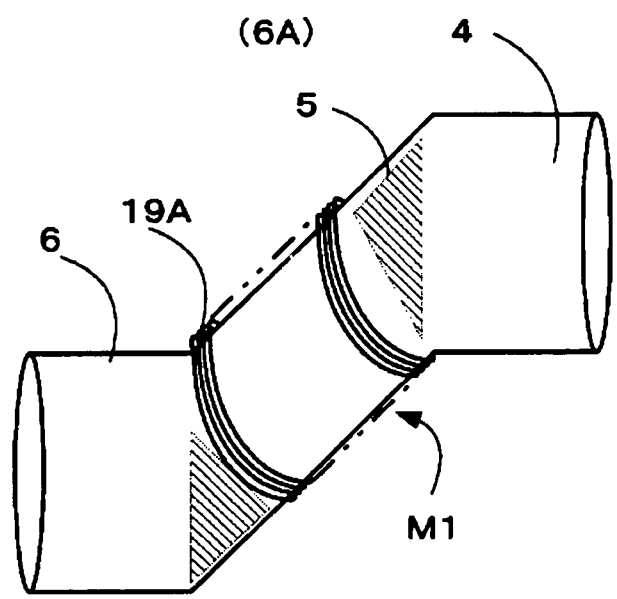
FIG. 6 is a set of schematic configuration diagrams of magnetic field coil for magnetic field generation for plasma transportation concerning, the second embodiment.
Figure 6:
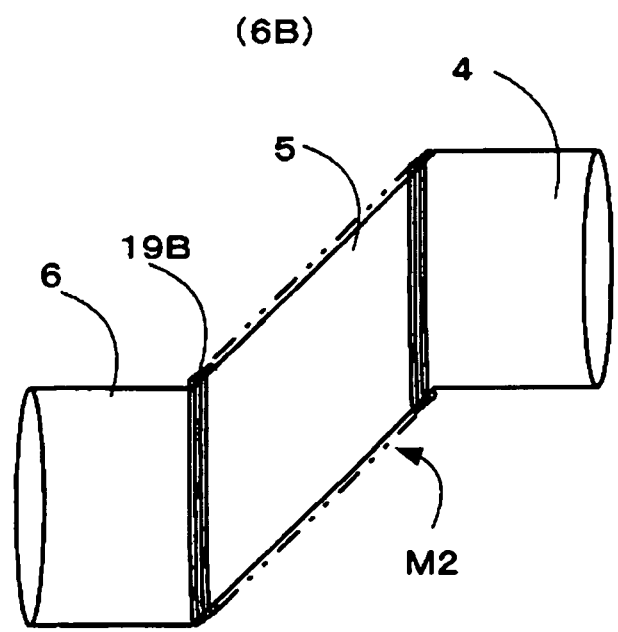

(6A) of FIG. 6 schematically shows state 19A in which a magnetic field coil for magnetic field generation for plasma transportation is wound around an inclinedly arranged second plasma advancing tube 5 in circle-like configuration M1 along the inclination axis. In this case, as shown by the hatch lines in the figure, a gap in which the coil is not wound is produced in the vicinity of the connecting section with another tube (4 or 6), producing a heterogeneous magnetic field, and reducing the plasma transport efficiency.

In the present embodiment, magnetic field coil 19 that is wound around the outer tube circumference of second plasma advancing tube 5 comprises a magnetic field coil that is wound elliptically along the inclination axis. (6B) of FIG. 6 schematically shows state 19B in which magnetic field coil 19 for magnetic field generation for plasma transportation is wound around an inclinedly arranged second plasma advancing tube 5 in ellipsis-like configuration M2 along the inclination axis. Because a gap such as one shown in the hatch line area in (6A) does not occur by setting up magnetic field coil 19 wound in ellipsis-like configuration M2 around second plasma advancing tube 5, the plasma transport efficiency is improved without generating a heterogeneous magnetic field by winding a magnetic field coil densely on the inclined surface of second plasma advancing tube 5, and a plasma treatment using highly dense and highly pure plasma can be made possible.

In a plasma advancing path comprising plasma advancing tube 3, first plasma advancing tube 4, second plasma advancing tube 5, and third plasma advancing tube 6, droplet collecting plates (baffles) 41, 42, 43, 44 are implanted on each tube inner wall surface. The structure of each collecting plate is explained in detail in the following.

Figure 7:
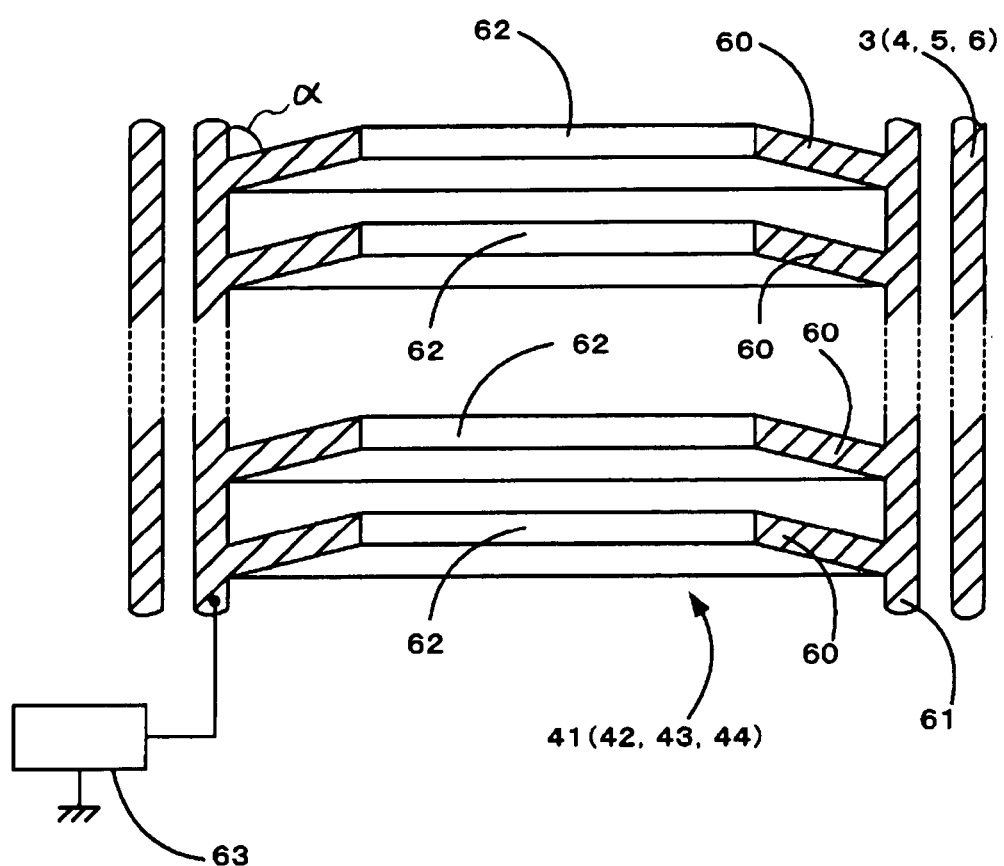
FIG. 7 is a partially enlarged sectional view of inner circumferential tube 61 concerning the second embodiment.

FIG. 7 is a partially enlarged sectional view of inner circumferential tube 61 equipped with droplet collecting plate 60. Inner circumferential tube 61 is contained and installed in each plasma tube passage (3-6), and on its inner wall, multiple droplet collecting plates 60 are implanted. Opening 62 for plasma stream circulation is formed at the center of droplet collecting plate 60. Plasma flows in from the top of the figure, and passes through opening 62. Inclination angle α of droplet collecting plate 60 is set within the range of 15-90°, but 30-60° is suitable from experience. In this embodiment, it is set to α=60°. By this inclination angle, the droplets that have been separated from the plasma stream can be adhered and collected surely as they reflect multiple times on droplet collecting plates 60.

The droplet adhesion surface area in inner circumferential tube 61 is increased by multiple droplet collecting plates 60, and scattering droplets can be surely adhered and collected in a large quantity. In the plasma advancing path, the installation number of droplet collecting plates 60 is limited by the tube length of inner circumferential tube 61. Because of this, to increase the droplet removal area, it is preferable to give a surface roughening processing on the surface of droplet collecting plates 60, so that a rough surface having innumerable unevenness is formed. That is to say, by making the surface of droplet collecting plates 60 rough-surfaced, the collecting area of droplet collecting plates 60 increases, and the collection efficiency can be improved. In addition, droplets that collide into a recess are adhered surely inside said recess, and the droplet collection efficiency increases markedly. A linear pattern processing and a satin processing can be used for the rough-surfacing process. As a linear pattern processing method, for example, an abrasion treatment with an abrasive paper is used. As a satin processing method, for example, pearskin finish can be applied on a small surface of droplet collecting plate 60 by means of a blasting treatment by alumina, shots, grids, glass beads and such, and in particular, by a microblast processing in which micron-sized particles are accelerated by compressed air and jetted through a nozzle.

The implanting area of droplet collecting plates 60 preferably is greater than or equal to 70% of the inner tube wall surface area. In the case of FIG. 2, the implanting area is set to approximately 90% of the inner tube wall area. The scattering droplets can surely be adhered and collected in a large quantity by increasing the droplet adhesion surface area of the tube for the plasma advancing path, and a high purification of the plasma stream can be realized.

Droplet collecting plate 60 is electrically insulated from the tube wall of each plasma traveling tube. Bias power supply 63 is connected to inner circumferential tube 61 as a bias voltage application means, and inner circumferential tube 61 can be set to positive or negative electric potential. In a case that the bias electric potential of inner circumferential tube 61 is positive, it has an effect that the positive ions of the plasma are pushed toward the transportation direction, and in a case that said potential is negative, it has an effect that the electrons of the plasma are pushed toward the transportation direction. The choice of either positive or negative is made in the way that it does not decrease the plasma transportation efficiency, and it is decided from the state of the plasma. The electric potential strength also is variable, and it is usually chosen to set the inner circumferential tube 61 to +15V, due to the standpoint of the transportation efficiency. By applying the above bias voltage to each droplet collecting plate, attenuation of the plasma can be restrained by adjusting its bias electric potential, and the plasma transportation efficiency can be increased.

In second plasma advancing tube 5, one or more apertures 70 that are movable along the tube axis direction may be set up. Said aperture 70 has a structure in which the installation position can be varied along the tube axis direction of second plasma advancing tube 5, and it may have a structure in which it can move forward and back, or a structure in which it can move toward only one direction. Because it is movable, the installation position of the aperture can be adjusted. It also can be removed for cleaning. This aperture 70 has an opening with a predetermined area at the center. The droplets are collided and captured on the peripheral wall surface of this opening, and the plasma that passes through said opening keeps advancing. Said opening can be designed in various manners. For example, it may be set up in the center or at an eccentric position. Therefore, if multiple apertures 70 are installed movably in second plasma advancing tube 5, the removal efficiency of droplets increases, and the plasma purity can be improved. In the following, an aperture movable in one direction that uses flat springs is shown.

Figure 8:
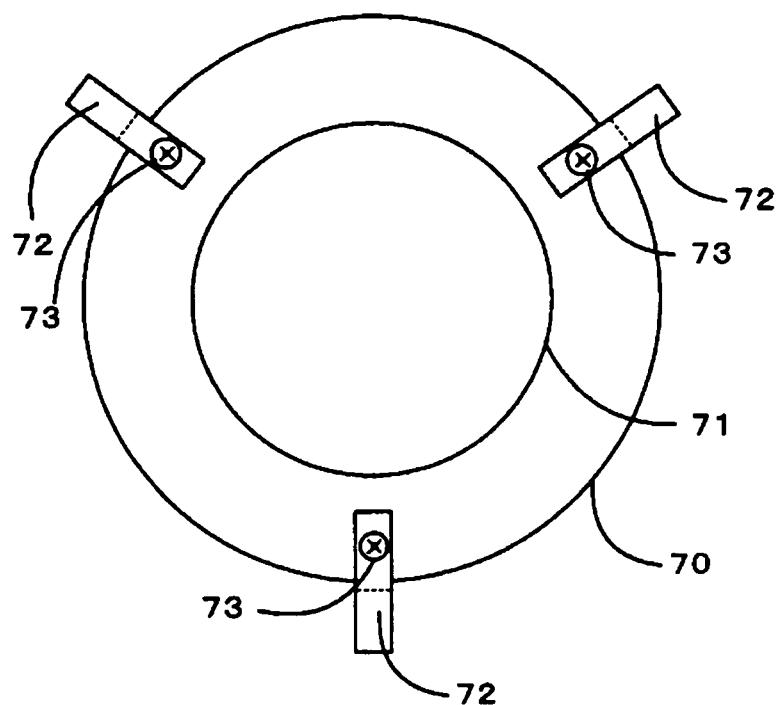
FIG. 8 is a plane view of movable aperture 70 and an installation state diagram of aperture 70 concerning the second embodiment.
Figure 8:
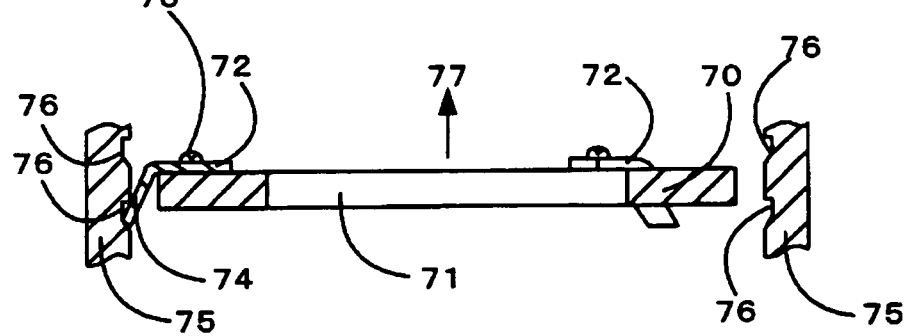

(8A) of FIG. 8 is a plane view of a movable aperture 70, and (8B) of the same figure shows an installation state of aperture 70. Aperture 70 has a ring configuration in which it has opening 71 of a predetermined area at the center. Here, by the placement configuration, the configuration of said opening can be designed in various manner such as a circle or an ellipsis. Stoppers 72 comprising elastic pieces protruding outward (for example, flat spring) are fixed to three places of aperture 70 by screws 73, but the fixing method, including welding, can be adopted arbitrarily. Protrusions 74 of the elastic pieces are flexed downward. As shown in (8B) of FIG. 8, engagement recesses 76 for holding aperture 70 are engraved beforehand in form of a circle on the inner wall of tube 75 in second plasma advancing tube 5. Engagement recesses 76 are set up in multiple numbers along the longitudinal direction of tube 75. When aperture 70 is inserted in tube 75 in the direction of arrow 77 in a state in which protrusions 74 of the elastic pieces are pointed downward, stoppers 72 move along the surface of the tube inner circumference as they bend. The direction the plasma stream is opposite the direction of arrow 77. Furthermore, when aperture 70 is pushed toward the direction of arrow 77, protrusions 74 of stoppers 72 spread at engagement recess 76 by the elastic pressing force, and they insert in engagement recess 76 and lock. Stoppers 72 cannot be reversed in this locking state, and aperture 70 can be set in this locking position. In changing the set location, when aperture 70 is pushed further toward the direction of arrow 77, the engagement of stoppers 72 is removed, and protrusions 74 can be inserted anew and locked into the next engagement recess 76.

Because aperture 70 has a structure in which it moves to an arbitrary setting location in second plasma advancing tube 5, droplets are captured by the diameter reduction of second plasma advancing tube 5 by aperture 70. Furthermore, the set location can be changed appropriately so that the capture quantity can be adjusted optimally, contributing to an improvement of the droplet removal efficiency. The number of apertures 70 that are set is 1 or greater than or equal to 2. By the way, opening 71 not only can be set up in the center of aperture 70, but also can be placed eccentrically, giving a function in which the plasma stream in the tube is made to meander.

Ring-shaped apertures may be set up in the connecting sections of the plasma advancing path comprising plasma advancing tube 3, first plasma advancing tube 4, second plasma advancing tube 5, and third plasma advancing tube 6. In the same manner as apertures 70, by setting up such apertures for the connecting sections, tube diameter of the plasma advancing path can be reduced, the path can be made eccentric, or both. Through this, even more droplets contained in the plasma stream can be captured, and the droplet removal efficiency can thus be improved.

In plasma generating apparatus of FIG. 1 and FIG. 2, third plasma advancing tube 6, the last stage, is built with the same tube size, but it is preferable to increase the density of the plasma stream furthermore in third plasma advancing tube 6, after the stream passes through the bent pathway and is exhausted from second plasma advancing tube 5. An embodiment in which a further density-increasing function is built into third plasma advancing tube 6 is shown in the following.

Figure 9:
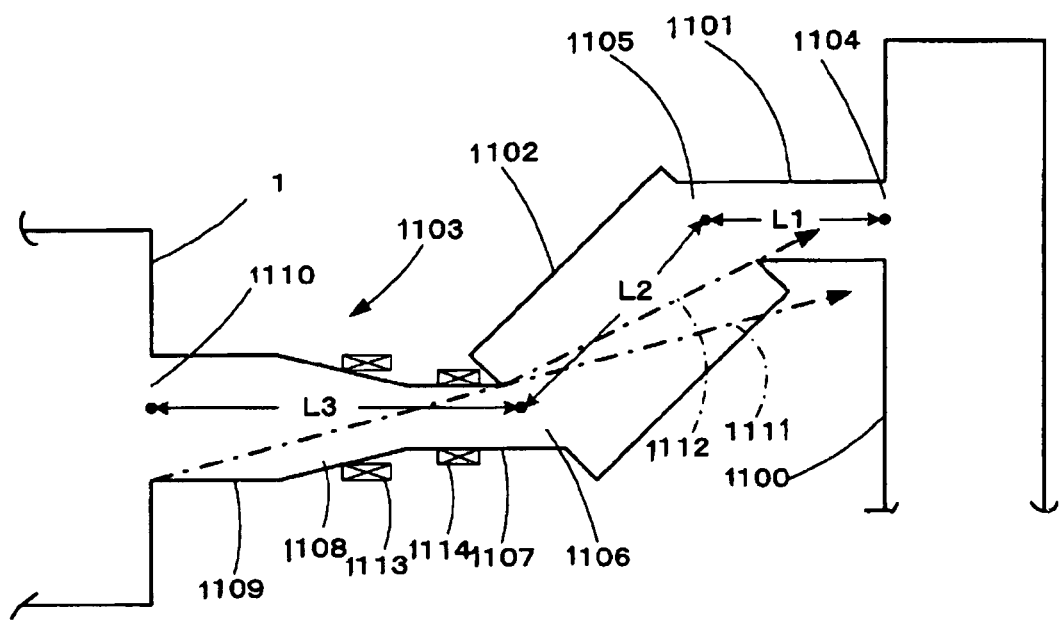
FIG. 9 is a summary configuration diagram of the plasma processing apparatus concerning the third embodiment.

FIG. 9 shows a summary configuration of the plasma processing apparatus concerning the third embodiment. The plasma processing apparatus of FIG. 9, in the same manner as FIG. 2, is provided with a plasma generation apparatus comprising a plasma generating portion (not shown) for generating the plasma that is supplied to plasma processing portion 1, and a plasma advancing path. The droplet removing section which is set up in the plasma advancing path, in the same manner as FIG. 2, comprises plasma advancing tube 1100 connected to the plasma generating portion, first plasma advancing tube 1101 connected to plasma advancing tube 1100 in a bent manner through connecting port 1104, second plasma advancing tube 1102 connected at the end of first plasma advancing tube 1101 by being arranged in a bent manner in a predetermined bending angle with respect to the tube axis, and third plasma advancing tube 1103 connected in a bent manner at the end of second plasma advancing tube 1102 so that the plasma is exhausted from plasma outlet 1106. By the way, it is not shown in the figure, but droplet collecting plates and a magnetic field coil for plasma transportation magnetic field generation are set up in the plasma advancing path.

The plasma advancing path that comprises plasma advancing tube 1100, first plasma advancing tube 1101, second plasma advancing tube 1102, and third plasma advancing tube 1103 is formed by being bent in three stages, in the same manner as the plasma advancing path of FIGS. 1 and 2. Third plasma advancing tube 1103 comprises rectifying tube 1107 connected at the end of second plasma advancing tube 1102, frustoconical tube 1108 that is connected to rectifying tube 1107 and becomes a deflection/oscillation tube; and outlet tube 1109. Frustoconical tube (deflection/oscillation tube) 1108 is expanded in diameter toward outlet tube 1109. Plasma outlet 1110 of outlet tube 1109 is connected to the plasma introduction port of plasma processing portion 1. Outlet tube 1109 has a uniform tube diameter. In the plasma advancing path concerning the present embodiment, plasma advancing lengths L1-L3 of each of first plasma advancing tube 1101, second plasma advancing tube 1102, and third plasma advancing tube 1103 are set to be the same as each plasma advancing tube of FIG. 1. In addition, second plasma advancing tube 1102 is arranged geometrically in the position away from the straight line of sight from plasma outlet 1110 of outlet tube 1109 to the plasma outlet 1105 side of first plasma advancing tube 1101, in the same manner as FIGS. 1 and 2. That is to say, the angle of elevation (θ) with respect to the line from the tube cross section top end at the plasma entrance port side of rectifying tube 1107 to the tube cross section bottom end at the plasma outlet 1105 side of first plasma advancing tube 1101, as shown by arrow 1111, satisfies θ≥θ$_0$ in the same manner as FIG. 1, when the angle of elevation with respect to the line from the tube cross section bottom end at the plasma outlet 1110 side of outlet tube 1109 to the tube cross section top end of plasma outlet 1106 side of second plasma advancing tube 1102, as shown by arrow 1112, is defined as (θ$_0$). Through the same geometric tube passage placement as in FIGS. 1 and 2, the straight-advancing droplets that are led out from first plasma advancing tube 1101 can be prevented from intruding third plasma advancing tube 1103 directly and being exhausted from plasma outlet 1110 of third plasma advancing tube 1103.

In the connecting section with third plasma advancing tube 1103 at the end of the diagonally arranged second plasma advancing tube 1102, in order to prevent the plasma advancing efficiency to the third plasma advancing tube 1103 side from dropping through meandering and diffusion of the plasma stream, rectifying magnetic field coil 1114 is set up in rectifying tube 1107 that is connected to the second plasma advancing tube, and a rectification magnetic field that rectifies while forcibly converging the flow of plasma that is supplied from second plasma advancing tube 1102 to rectifying tube 1107 is generated in the tube. Through this rectification magnetic field, the plasma flowing to second plasma advancing tube 1102 can drawn in a converged manner to the third plasma advancing tube 1103 side, and a generation of plasma with high density and high purity becomes possible.

Figure 10:
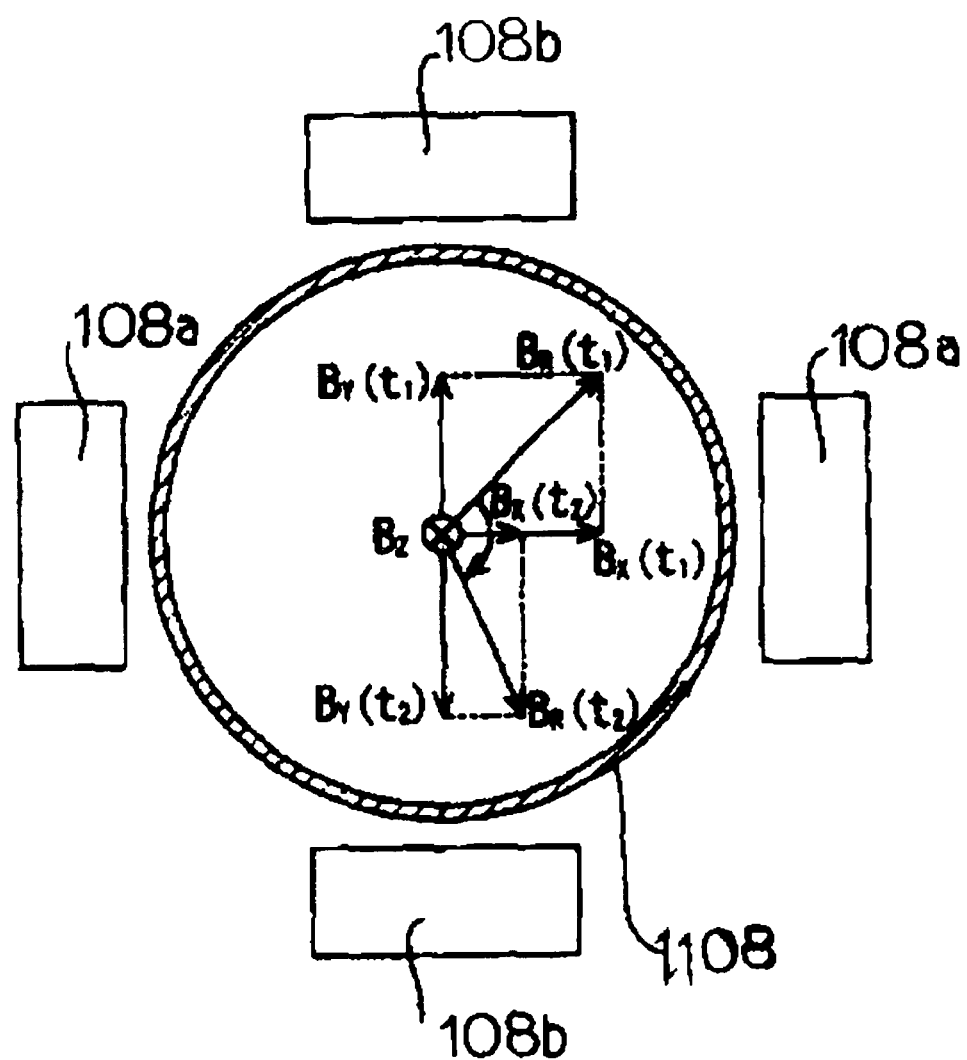
FIG. 10 is an explanatory diagram of the magnetic field for scanning that is formed in frustoconical tube (deflection/oscillation tube) 1108 concerning the third embodiment.

FIG. 10 is an explanatory diagram of the magnetic field for scanning that is formed in frustoconical tube (deflection/oscillation tube) 1108 (shown in FIG. 9) concerning the third embodiment. As shown in FIGS. 9 and 10, magnetic field coils 1113 for scanning are provided near frustoconical tube (deflection/oscillation tube) 1108 that is connected to rectifying tube 1107, in order to scan the plasma stream in a similar manner to a CRT display by oscillating said plasma stream in the left-right/top-bottom directions after it has been converged and rectified by the rectification magnetic field effect. Magnetic field coils 1113 for scanning comprise a pair of X-direction oscillating magnetic field generators 108a, 108a and a pair of Y-direction oscillating magnetic field generators 108b, 108b.

The relation between X-direction oscillating magnetic field $B_X(t)$ of time t by X-direction oscillating magnetic field generators 108a, 108a, Y-direction oscillating magnetic field $B_Y(t)$ of time t by Y-direction oscillating magnetic field generators 108b, 108b, and scanning magnetic field $B_R(t)$ of time t is shown. Scanning magnetic field $B_R(t)$ is the synthesized magnetic field of X-direction oscillating magnetic field $B_X(t)$ and Y-direction oscillating magnetic field $B_Y(t)$. To explain in detail, while oscillating the plasma stream left-right by the X-direction oscillating magnetic field, said plasma stream is scanned top-bottom by the Y-direction oscillating magnetic field, and by repeating this, a plasma exposure to a large area inside plasma processing portion 1 is made possible. When the cross section area of the plasma stream is smaller than the cross section area of the object to be treated that is arranged in plasma treatment portion 1, a plasma exposure on the entire surface of the object to be treated is made possible by scanning the plasma stream top-bottom and left-right. For example, the same principle is used as when the electron beam of a CRT display moves up and down while it oscillates left and right, and the entire surface of the display screen emits light by a repetition of this movement. In FIG. 10, magnetic field for scanning $B_R(t_1)$ is synthesized from oscillating magnetic fields $B_X(t_1)$ and $B_Y(t_1)$ at time $t=t_1$. While this magnetic field for scanning $B_R(t_1)$ oscillates left and right, magnetic field for scanning $B_R(t_2)$ is formed from oscillating magnetic field $B_X(t_2)$ and $B_Y(t_2)$ at time $t=t_2$, and the plasma stream can thus be deflected and oscillated in practically the entire surface of the tube.

The present invention is not limited to the embodiments described above. Various modifications, design alterations, and others that do not involve a departure from the technical concept of the present invention are also included in the technical scope of the present invention.

<Industrial Applicability>

The plasma generating apparatus concerning the present invention can introduce a highly pure plasma stream that is uniform into a plasma processing portion, by setting up a droplet removing section in a plasma advancing path. In addition, by using the high purity plasma generated by the plasma generating apparatus concerning the present invention, a highly pure film with markedly few defects and impurities on the surface of the solid material can be formed in the plasma, or by irradiating the plasma, the solid surface characteristics can be reformed uniformly without giving defects and impurities. For example, a plasma processing apparatus that can form an abrasion resistance/corrosion resistance reinforcement film, a protective film, an optical thin film, a transparent electroconductive film or such on a solid surface with high quality and high precision can be provided.

The invention claimed is:

1. A plasma generating apparatus, comprising
a plasma generating portion that generates plasma from a target surface by a vacuum arc discharge under a vacuum environment,
a plasma advancing path that advances the plasma generated by said plasma generating portion, and
a droplet removing portion that removes cathode material particles produced as byproducts from the cathode at the generation time of the plasma while positioned on said plasma advancing path,
where said droplet removing portion comprises
a plasma advancing tube that is connected to said plasma generating portion,
a first plasma advancing tube that is connected in a bent manner to said plasma advancing tube,
a second plasma advancing tube that is connected at the end of said first plasma advancing tube so that it is inclinedly arranged at a predetermined bending angle with respect to the tube axis,
a third plasma advancing tube that is connected in a bent manner at the finishing end of said second plasma advancing tube so that said plasma is exhausted from a plasma outlet, and
the total length L for said plasma to arrive from said target surface to an object to be treated that is set up to satisfy 900 mm≤L≤1350 mm,
wherein in a connecting portion between said second plasma advancing tube and said third plasma advancing tube,
there are set up a rectification magnetic field generating means that converges and rectifies said plasma that is supplied from said second plasma advancing tube to said third plasma advancing tube in an advancing direction, and
a magnetic field coil for scanning is provided to make possible a plasma exposure to a large area and to scan said plasma by oscillating said plasma with different frequencies in left-right and top-bottom directions after said plasma has been converged and rectified.

2. The plasma generating apparatus according to claim 1, wherein said second plasma advancing tube is arranged geometrically at a position off the straight line of sight between the plasma outlet side of said first plasma advancing tube and the plasma outlet of said third plasma advancing tube.

3. The plasma generating apparatus according to claim 2, wherein $\theta \geq \theta_0$ is satisfied when
the angle of elevation with respect to the line from the tube cross section top end at the plasma entrance port side of said third plasma advancing tube to the tube cross section bottom end at the plasma outlet side of said first plasma advancing tube is defined as $\theta$, and
the angle of elevation with respect to the line from the tube cross section bottom end at the plasma outlet side of said third plasma advancing tube to the tube cross section top end at the plasma outlet side of said second plasma advancing tube is defined as $\theta_0$.

4. The plasma generating apparatus according to claim 1, 2, or 3, wherein
a magnetic field generating means for plasma transportation is established for generating a magnetic field for plasma transportation in each of said plasma advancing tube, said first plasma advancing tube, said second plasma advancing tube, and said third plasma advancing tube,
a deflection magnetic field generating means for deflecting said magnetic field for plasma transportation is installed in said first plasma advancing tube and/or said second plasma advancing tube, and
plasma stream is deflected to the tube center through the deflection magnetic field generated by said deflection magnetic field generating means.

5. The plasma generating apparatus according to claim 4, wherein said deflection magnetic field generating means comprises
a yoke that is arranged at the outer circumference of said first plasma advancing tube and/or said second plasma advancing tube, and
a magnetic field coil wound around said yoke, said yoke being adjusted by sliding along the tube axis direction, rotating along the circumferential direction, and/or swinging toward the tube axis direction.

6. The plasma generating apparatus according to claim 4, wherein said magnetic field generating means for plasma transportation comprises a magnetic field coil that is wound around the outer tube circumference of each of said plasma advancing tube, said first plasma advancing tube, said second plasma advancing tube, and said third plasma advancing tube.

7. The plasma generating apparatus according to claim 6, wherein the magnetic field coil that is wound around the outer tube circumference of said second plasma advancing tube comprises a magnetic field coil that is wound elliptically against the outer tube circumference along the inclination axis.

8. The plasma generating apparatus according to claim 1, 2 or 3, wherein
a droplet collecting plate is implanted on the inner tube wall surface of each of said plasma advancing tube, said first plasma advancing tube, said second plasma advancing tube, and said third plasma advancing tube, and
said implanting area is greater than or equal to 70% of the inner tube wall surface area.

9. The plasma generating apparatus according to claim 1, 2, or 3, wherein
said second plasma advancing tube is set up as a radially enlarged tube,
said first plasma advancing tube is set up as an introduction side radially reduced tube that is connected at the starting end on the plasma introduction side of said radially enlarged tube, and
said third plasma advancing tube is set up as a discharge side radially reduced tube that is connected at the finishing end on the plasma discharge side of said radially enlarged tube.

10. The plasma generating apparatus according to claim 1, 2 or 3, wherein
said magnetic field coil for scanning comprises a pair of X-direction oscillating magnetic field generators and a pair of Y-direction oscillating magnetic field generators, and
by making a frequency of an X-direction oscillating magnetic field different from a frequency of a Y-direction oscillating magnetic field, said plasma exposure to said large area is made possible.

11. The plasma generating apparatus according to claim 8, wherein
- the droplet collecting plate implanted in said second plasma advancing tube is shielded electrically from the tube wall of said second plasma advancing tube, and
- a bias voltage application means for applying a bias voltage to said droplet collecting plate is installed.

12. The plasma generating apparatus according to claim 1, 2 or 3, wherein
- one or more apertures whose installation position can be varied along the tube axis direction are set up in said second plasma advancing tube, and
- said aperture has an opening with a predetermined area.

13. A plasma processing apparatus, comprising
- the plasma generating apparatus according to claim 1, 2 or 3 and
- a plasma processing portion in which an object to be treated is installed,
- where the plasma outlet of said third plasma advancing tube is connected to a plasma introduction port of said plasma processing portion.

* * * * *